United States Patent [19]
Oswald et al.

[11] Patent Number: 5,184,081
[45] Date of Patent: Feb. 2, 1993

[54] FAULT LOCATION

[75] Inventors: Thomas Oswald, Dartford; Ian J. Hirst, Orpington, both of United Kingdom

[73] Assignee: Northern Telecom Europe, London, England

[21] Appl. No.: 671,452

[22] Filed: Mar. 19, 1991

[30] Foreign Application Priority Data

Mar. 22, 1990 [GB] United Kingdom ............... 9006447

[51] Int. Cl.$^5$ ............................................. G01R 31/11
[52] U.S. Cl. ................................. 324/533; 356/73.1; 324/532
[58] Field of Search ............... 324/532, 533, 534, 535; 356/73.1

[56] References Cited

U.S. PATENT DOCUMENTS

| | | | |
|---|---|---|---|
| 3,612,782 | 10/1971 | Gilbert | 324/534 |
| 4,006,320 | 2/1977 | Marki | 324/532 |
| 4,300,239 | 11/1981 | Wakabayashi et al. | 356/73.1 |
| 4,499,417 | 2/1985 | Wright et al. | 324/533 |
| 4,606,632 | 8/1986 | Hillerich | 356/73.1 |

FOREIGN PATENT DOCUMENTS

| | | | |
|---|---|---|---|
| 1137787 | 12/1982 | Canada | 324/534 |
| 2318424 | 10/1974 | Fed. Rep. of Germany | 324/535 |
| 160773 | 9/1984 | Japan | 324/534 |
| 69230 | 4/1986 | Japan | 324/534 |
| 55570 | 3/1987 | Japan | 324/532 |
| 7508121 | 1/1976 | Netherlands | 324/534 |

OTHER PUBLICATIONS

Rosher, et al., "An automatic optical fibre break location scheme for duplex and diplex transmission systems", *Br. Telecom Technology*, vol. 6, No. 1, p. 54, Jan. 1988.

IBM Technical Disclosure Bulletin vol. 21, No. 9, Feb. 1979 Testing Telecommunication Cables for Damage Szeredi.

*Primary Examiner*—Jack B. Harvey
*Assistant Examiner*—Maura K. Regan
*Attorney, Agent, or Firm*—Lee, Mann, Smith, McWilliam, Sweeney & Ohlson

[57] ABSTRACT

A method of locating an intermittent electrical fault in an optical undersea transmission system, comprises measuring the time difference between two signals emanating from the fault along two different routes of the system. In one embodiment one of the signals is a voltage transient and the other signal is an optical error signal created in a repeater adjacent the fault as a result of surge protection in the repeater responding to the electrical fault, and in another embodiment both signals are optical signals, once again emanating from adjacent repeaters and caused by the effect of the electrical fault on the adjacent repeaters. It is envisaged that such a transmission system could be permanently provided with apparatus to detect such a fault in which synchronized counters are permanently running and frequently re-set and which stop in response to error signals being received from a fault when it occurs.

8 Claims, 6 Drawing Sheets

| FREQUENCY (Hz) | 0.01 | 0.1 | 1.0 | 10 | 100 | $10^3$ | $10^4$ | $10^5$ | $10^6$ | $10^7$ |
|---|---|---|---|---|---|---|---|---|---|---|
| CAPACITANCE (uF/Km) | 0.192 | | | | | | | | | |
| RESISTANCE ( /Km) | 0.625 | 0.625 | 0.64 | 0.68 | 1.20 | 4.7 | 18 | 63 | 220 | 750 |
| INDUCTANCE (uH/Km) | 4900 | 4900 | 4800 | | 2470 | 1100 | 500 | 250 | 167 | 140 |
| ATTENUATION (dB/Km) | $5.3 \times 10^{-4}$ | $1.7 \times 10^{-3}$ | $5.3 \times 10^{-3}$ | .014 | .043 | .26 | 1.45 | 7.4 | 32 | 121 |
| PHASE VELOCITY (Km/MILLISEC) | 1.02 | 3.23 | 9.87 | 25.0 | 43.2 | 65.5 | 98.5 | 142 | 176 | 193 |
| CHARACTERISTIC IMPEDANCE ( ) | 7200 | 2280 | 729 | 248 | 128 | 83 | 55 | 37.5 | 29.8 | 27.1 |
| ANGLE OF C.IMP (DEGREES) | -45 | -44.9 | -43.6 | -33 | -18.9 | -17.1 | -14.7 | -10.9 | -5.9 | -2.4 |

FAULT LOCATION

This invention relates to locating faults in an undersea telecommunications system, particularly an optical repeatered system.

BACKGROUND OF THE INVENTION

Various faults could occur in an optical repeatered undersea system and if the fault needs to be repaired then it is important to be able to determine accurately the location of the fault so that the repair ship can get close to the fault when it recovers the cable. Otherwise if the fault is found to be some distance from the point of cable recovery, much time and effort can be wasted.

Faults fall basically into two categories. An optical fault while the system remains powered and an electrical fault in the power feed system. Both optical and electrical faults can occur together.

A known technique for optical fault location relies upon a loopback arrangement in the repeaters whereby on command from a terminal at an end of the system, each repeater in turn has the go signal fibre path looped back to the return fibre path. When the faulty repeater or cable section is reached then either the looped back signal fails or is corrupted so that the section or repeater can be identified.

Another technique relies upon the received light level coming into a regenerator and locating the regenerator which receives no or diminished light, to once again determine the leg or repeater which is faulty.

As the repeater spacing is becoming larger with improved fibre properties, currently around 60 or 70 kilometres, then this system is rather crude because the fault can lie anywhere along a 60 or 70 kilometre length of cable. The exact location is determined by lifting the cable at some point along the length containing the fault, cutting the cable and using for example a back scatter technique from the cut end to determine where from the cut the fault lies. If it is far from the cut then the cut is repaired by inserting a short fresh cable length across the cut end, relaying the recovered cable with its repaired cut, and then proceeding to the precise location of the fault as determined by the back scatter measurement, and subsequently making a repair by recovering and repairing the cable.

A paper entitled "An automatic optical fibre break location scheme for duplex and diplex transmission systems" in Br. Telecom Technology Journal Vol 6, No 1 January 1988 at page 54, provides a solution to locating a fibre break. This technique relies on observing and comparing the arrival time of the signal represented by loss of data or loss of light, in the broken fibre. The authors report that it is fairly accurate in a duplex system where the fibre operates at different wavelengths in opposite directions but no so accurate for a diplex system where operation at different wavelengths is in the same direction. This technique is not suitable however for current submarine systems, which are simplex systems.

When an electrical fault occurs caused e.g. by a trawler or anchor mauling the cable, without breaking it, then if the fault causes a short circuit he location of the fault can be made using the fact that at the fault the electrical conductor carrying the power is shorted to earth (the sea). The system will be powered from both ends, positive at one end and negative at the other. By adjusting the terminal voltages so that no current is lost at the fault i.e. the voltage gradient reaches zero at the fault, then the location of the fault can be found since the distance of the fault from either terminal will be in proportion to the voltage at that terminal required to produce zero current at the fault. Other methods involving resistance and voltage measurement are possible also.

If the electrical fault results in an open circuit then a capacitive technique can be used based on a knowledge of the capacitance per unit length of the cable.

None of the above techniques however is suitable if an intermittent electrical fault occurs.

It is an object of the present invention to devise a technique to locate an intermittent electrical fault in a simple manner.

SUMMARY OF THE INVENTION

According to the present invention there is provided a method of locating an electrical fault in the power feed circuit of an optical repeatered system, comprising detecting the arrival of a first optical error signal at a terminal of the system, detecting the arrival of a second signal at a terminal of the system, said first signal having arisen at a repeater adjacent the fault as a result of said electrical fault and travelled to said terminal via a first path, said second signal either being an electrical surge pulse which has travelled from the fault to a terminal via a power conductor of the system, or being a second optical error signal which has arisen at a repeater adjacent the fault and travelled to a second terminal of the system via a second path, and determining the location of the fault by determining the time separation between the arrival of said first and second signal, and the rate of travel of the signals.

In one embodiment of the invention the first signal is the optical error signal caused by a regenerator malfunction and travelling along an optical route in one direction away from the regenerator to a first terminal of the system, and the second signal is also an optical error signal originating at the same or approximately the same point in time as the first signal, but travelling away from the regenerator along an optical path in the opposite direction towards a second terminal of the system.

Such a technique is particularly useful for locating an intermittent electrical fault for example which occurs when the system voltage is raised to a certain level at one end, but which is not triggered below that level, since the system can remain powered up until the fault is triggered, so that the time measurement can be made before the system is shut down following occurrence of the fault. Local surge protection devices in each regenerator will protect the individual regenerators but will cause each regenerator to produce errors prior to shutdown as the voltage transient reaches the regenerator.

The speed of optical signal transmission in such a system will be approximately ⅔ of the speed of light in vacuo owing to the refractive index of the fibre, and the speed of transmission through the electrical conductor of the voltage transient will be slower than the speed of light transmission through the fibre.

BRIEF DESCRIPTION OF THE DRAWINGS

In order that the invention can be clearly understood reference will now be made to the accompanying drawings in which.

DESCRIPTION OF PREFERRED EMBODIMENT

Figure 1:
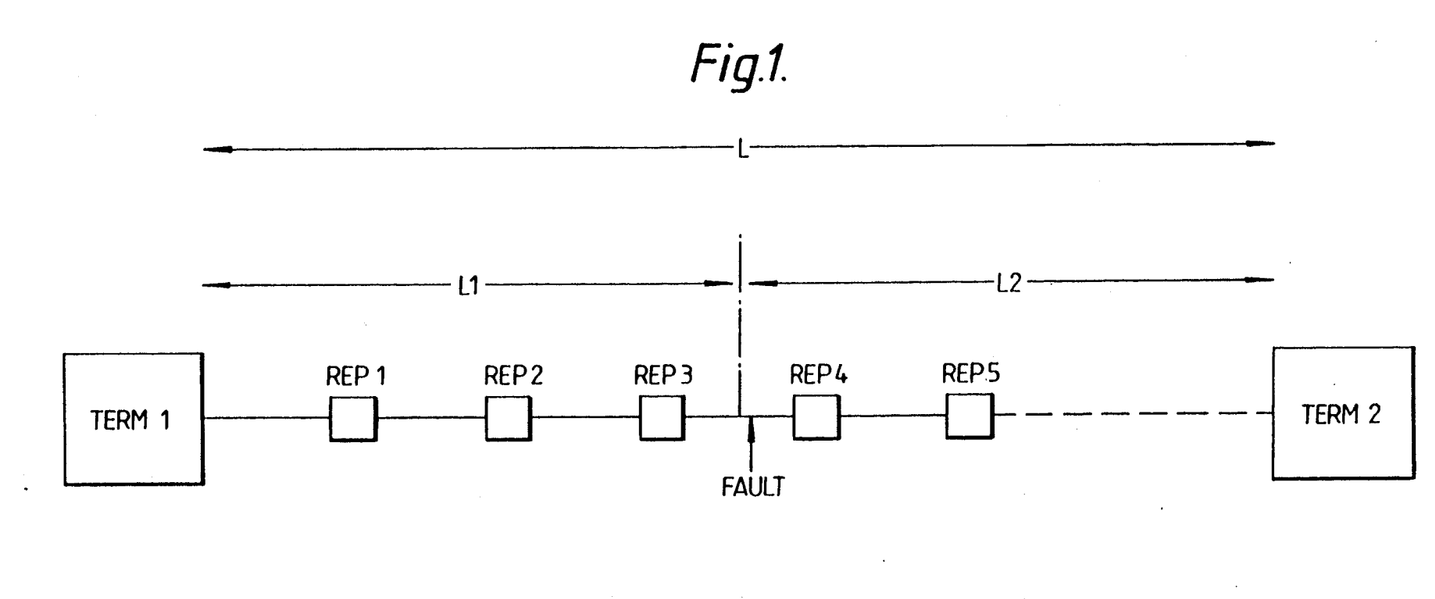
FIG. 1 showing schematically a repeatered undersea optical system in which a fault exists.
Figure 2:
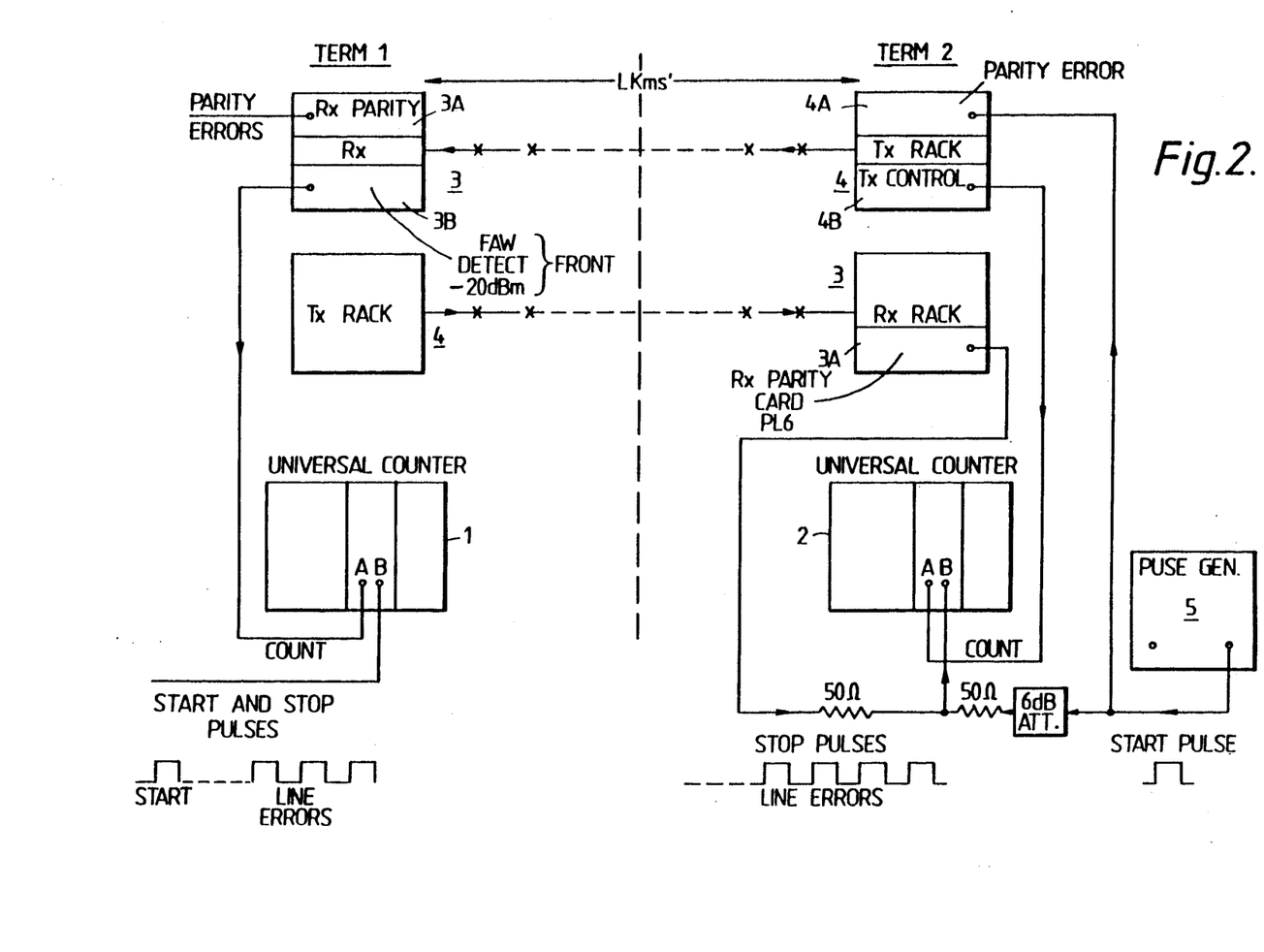
FIG. 2 shows diagrammatically a fault location system for the optical undersea telecommunications system of FIG. 1 and in accordance with a first embodiment of the invention.

Referring to FIGS. 1 and 2 there is shown diagrammatically a fault location system in accordance with a first embodiment of the invention. The method is designed to determine the location of a high voltage fault by predicting the fault location from measurements on the system.

The method assumes that the voltage transient on the cable power conductor due to the fault will induce line errors in both directions at adjacent repeaters. Referring to FIG. 1 there is shown schematically an undersea optical transmission system extending from a first terminal TERM 1 on land under the water to second terminal TERM 2 on land, at another location via repeaters REP 1 to REP 5, as shown and the broken portion of the cable indicates more repeaters than those shown in FIG. 1. It is assumed that a high voltage short circuit fault of an intermittent nature has occurred in the cable leg extending between REP 3 and REP 4 as shown in FIG. 1.

As a result of this fault, line errors will be induced in both directions at the adjacent repeaters REP 3 and REP 4. Each of the terminals TERM 1 and TERM 2 will receive these errors after a delay which is proportional to the distance of the fault from the terminal. If the time that these errors are first observed at terminals TERM 1 and TERM 2 is T1 and T2 and the velocity of the line errors is v, and if L is the distance between the two terminals then the distance of the fault from each terminal is $$L1 = [L - (T2 - T1)*v]/2 \quad \ldots \quad 1.$$
$$L2 = [L + (T2 - T1)*v]/2 \quad \ldots \quad 2.$$

where;
L1 is the fault distance from TERM 1.
L2 is the fault distance from TERM 2.

If there are more than two terminals shown in FIG. 1 e.g. other terminals may be connected to the system via a branching unit, then measurement ca be made at each terminal so that some averaging is possible. The velocity v can easily be measured by a loopback method (inject an error at a terminal, start counter, stop counter when the loopback returns the error to the terminal).

The time differences can be measured accurately by using counters which are started by an error transmitted from one terminal and stopped by the errors generated by the fault. The clock or a divided clock is used as a source for the counters. In order to prevent counter overflow, periodic resetting of the counters may be required.

As shown in FIG. 1 the fault site is not at a repeater. Nevertheless equations 1 and 2 will still produce the correct answer, if it is assumed that the transient speed is the same as the error speed. Although the transient does not generate errors, the errors that are produced in the adjacent repeaters on either side of the fault have the correct relative timings and thus the fault site appears as the source of the errors. If the transient and the errors have different speeds then a correction can be made if the transient speed is known.

FIG. 2 shows the set up at terminal TERM 1 and TERM 2. A counter 1 and 2 at each terminal is used to count the Frame Alignment Word (FAW) pulses. Because the terminals are connected by the optical link, the frame alignment word (FAW) pulse rate is exactly the same at the TX and RX racks at each terminal and provides a common clock for measurement.

Each terminal also has a receive rack 3 and transmit rack 4, including a unit 3A for error detection, a unit 3B for FAW pulse detection, a unit 4A for error injection and a unit 4B for FAW pulse detection.

The counters 1 and 2 are started by the injection of a single error at the transmit rack 4 of terminal 2 by means of a pulse from a pulse generator 5. The counter 2 at this terminal is connected to the pulse generator and starts immediately. When the single error arrives at the other terminal TERM 1 after a delay of Nt clock pulses, its counter 1 starts.

If there is a high voltage fault as indicated in FIG. 1, errors will be generated on all the fibres at the same time (assumption). These errors will propagate to the terminals where they will stop the counters 1 and 2. As the propagation time from the fault to the terminals depends on the fault location the clocks will be stopped at different times T1 and T2 respectively. By noting the number of counts on the stopped counters, the fault location can be obtained as follows:

The differential time for the errors to reach the terminals is:

$$T2 - T1 = ([N2 - Nt] - N1)/FREQ \text{ Seconds} \quad 3$$

for N2−Nt N1 i.e. the fault is closer to terminal TERM 1
where:
N1 is the count at terminal TERM 1
N2 is the count at terminal TERM 2
Nt is the number of clock pulses for the signal (single error) to transit from terminal TERM 2 to terminal TERM 1 (terminal TERM 2 is Nt pulses ahead of terminal TERM 1)
FREQ is the frame frequency (Hz).

By substituting T2−T1 into equations 1 and 2, L1 and L2 may be found.

It is shown below that the difference between the counts is equal to the number of clock periods N that are required for a bit to travel round the loop from terminal TERM 2 to the fault and back again.

With both counters set to zero, the start pulse is sent from terminal TERM 2. After Nt pulses counter 2 reads Nt and counter 1 reads O. After X further pulses counter 2 reads X+Nt and counter 1 reads X. At this time, the HV fault generates errors at the fault site. If the number of additional clock pulses that are counted on counter 2 and counter 1 are N2 and N1 in the time taken for the errors to transit from the fault to the terminals, then the readings on the counters will be Nt+X+N2 at terminal TERM 2 and X+N1 at terminal TERM 1.

The count difference between the counters is N2+Nt−N1. But as N1+N2=Nt then the count difference must be N2+N2+N1−N1 or 2*N2, which is the number of clock pulses taken for an error to transit the loop from terminal 2 to the fault and back.

In order to calibrate the measurement system the following steps are taken:

Step 1 The terminals are set up according to FIG. 2.
Step 2 A loopback is set up at terminal 1 between the receiver rack 3 and the transmit rack 4.
Step 3 One error is injected at terminal TERM 2 by means of the pulse generator 5. The counter 2 at terminal 2 starts. When the error has transited round the loop and arrives back at terminal 2, the counter stops. Then Nt=counter reading/2.

The speed V may be obtained from the (loop length)/(count/FREQ). Table 1 shows the measured and calculated counts measured at terminal TERM 2 for a loop at every repeater R1 to R5.

MEASUREMENT. The terminals are set up as in FIG. 2. The counters are started by injecting a single error at terminal TERM 2, and the voltage at terminal TERM 1 is ramped up until the HV fault occurs which will stop the counters. The counter readings at both terminals are then noted, and may produce readings as shown below:

|  | Counter 1 | Counter 2 | Counter diff. 2-1 |
|---|---|---|---|
| Run 1 | 300,000,000 | 300,012,400 | 12400 |
| Run 2 | 500,000,000 | 500,012,401 | 12401 |
| Run 3 | 413,713,317 | 413,725,716 | 12399 |

A fault can be simulated by starting the counters as in FIG. 2 and then putting repeaters into loopback to generate the errors. Figures obtained might be as follows:

| Loopback R1 | 5829486 | 5841486 | 12000 |
| Loopback R2 | 7677739 | 7690039 | 12300 |
| Loopback R3 | 4465211 | 4474811 | 12600 |
| Loopback R4 | 8059424 | 8072324 | 12900 |

From the above, it can be seen that the fault lies between R2 and R3. Using the count for the fault (12400) the distance from TERM 2 is given by:

$$L1 = (Count\ R2 - fault\ count)/(Count\ R2) * System\ length$$

The above assumes that the voltage transient travels at the same speed V as the errors. From calculations made using the cable parameters, the speed of the transient V will be slower than the transmission speed of the errors. Knowing these speeds allows a correction to be made as follows:

Let the fault lie at a distance X Kms from R2. Then travel count time from the fault to terminal TERM 2 is:

$$N(R2) + X*f/v$$

where f is the FAW pulse rate and v is the transient speed.

Similarly, the count time from the fault to terminal TERM 1 is;

$$N(R3) + distance(R2\ to\ R3)*f/v = X*f/v$$

The difference between the two travel counts must be the count obtained for the fault minus Nt.

The fact that the transient speed is slower than the error speed means that if a fault lies in the vicinity of a repeater then the method will always give the repeater as the fault site (if fault lies within about 8 KMs of that repeater). This is because the transient goes in both directions from the fault to the adjacent repeaters and the fault transient will be overtaken by the errors from the near repeater as that transient transits to the far repeater.

To summarise therefore, a new method has been presented for locating non-permanent shunt faults which can not be located by DC testing.

Referring now to FIGS. 3 to 6 of the drawings an alternative embodiment of the invention will now be described.

When a short circuit (fault) occurs on a cable operating at high voltage, there is an abrupt current surge. When this surge arrives at the nearest repeater it alters the operating conditions of its regenerators so that they produce errors in the digital traffic stream. These errors travel to the terminal at the speed of light in the glass fibres (about 204.5* Km per millisecond). This error signal thus overtakes the transmission of the surge itself to the terminal, the speed of which is a complicated function of the cable parameters and the distance travelled. Thus, the difference in time t between the arrival of the errors and of the power surge is a measure of the distance of the fault from the terminal—if there is at least one intervening repeater—and consists of:

(Transmission time t1 of the surge to the terminal)
(transmission time t2 of the errors to the terminal)
(transmission time t3 of the surge to the nearest repeater) i.e. $t = t_1 - t_2 - t_3$.

Figure 4:
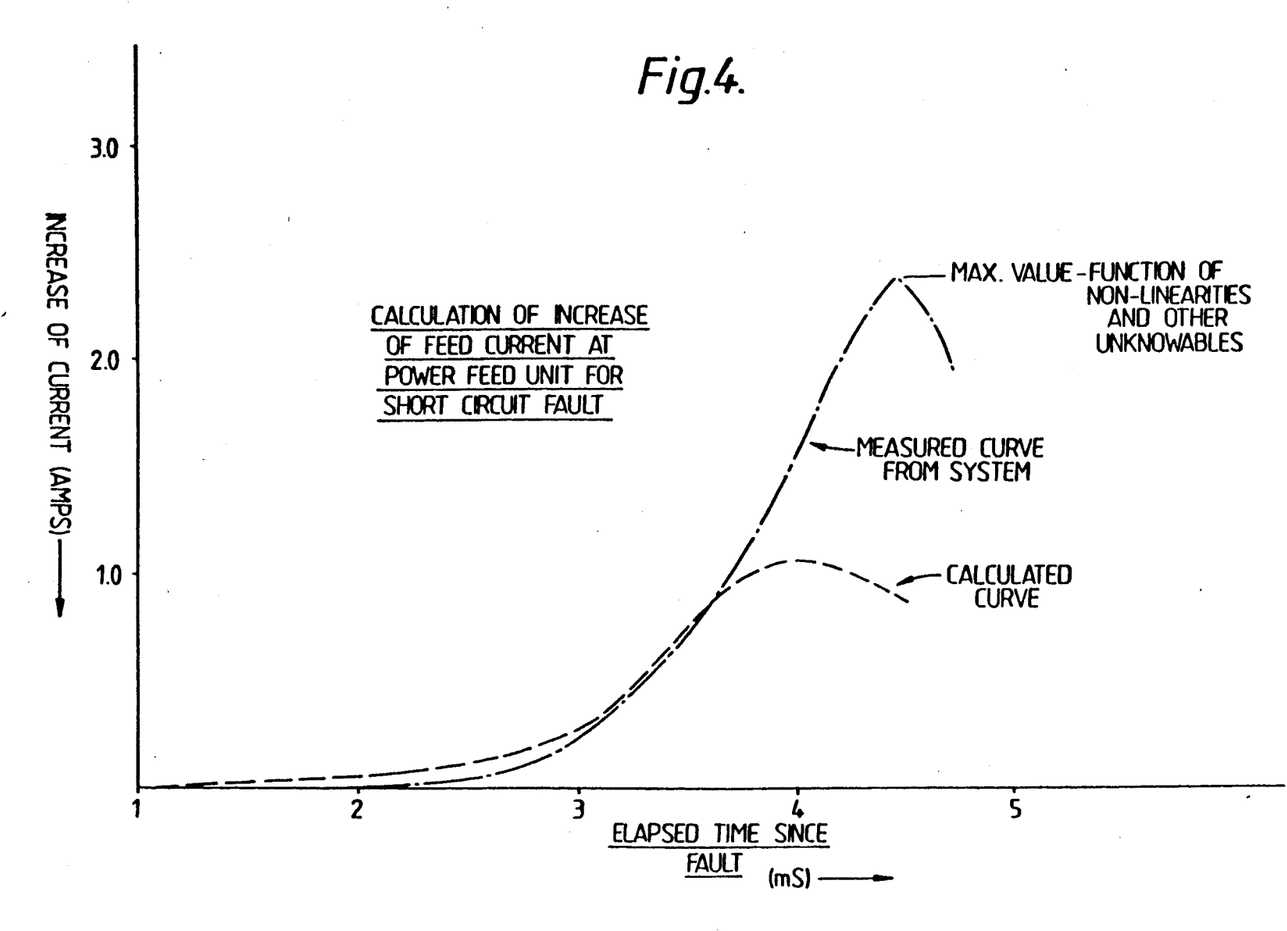
FIG. 4 shows a record similar to that of FIG. 3 but on a larger scale and with time correction included, in which a measured and calculated curve are matched together.

The location procedure is:

(i) Postulate a length from the terminal to the fault.
(ii) From the system layout diagram of FIG. 1 split this length up into the length from the fault to the nearest repeater and the length from the nearest repeater to the terminal. Then $t_2$ can be calculated (from * above) and $t_3$ can be calculated (from FIG. 7—derived from the cable data of FIG. 5).
(iii) Add $t_2$ and $t_3$ to the measured value t to give a value for $t_1$.
(iv) Calculate $t_1$ from the cable parameters and match the arrival curve of the surge against the arrival curve actually measured. The high current part of the measured arrival curve is a function of the unknown (and non-linear) behaviour of the power feed unit (PFU) outside its working range, so that it is important only to match up the low current part of the curve (e.g. ½ amp or less) where the impedance of the power unit is reasonably constant and linear. FIG. 4 shows an example of this matching process.
(v) A reiteration of the process (i) to (iv) is made until the best match is found.

Note that a first estimate of the fault-distance can be found by neglecting $t_3$, which is a small correction, if there are a reasonable number of repeaters, and noting that the length to the fault is then $$t/\left(\frac{1}{v'} - \frac{1}{v}\right)$$

where v is the speed of light in the fibre (*above) and $v^1$ is the speed of the initial wavefront of the surge (about 2-2½ times less than v).

Figure 3:
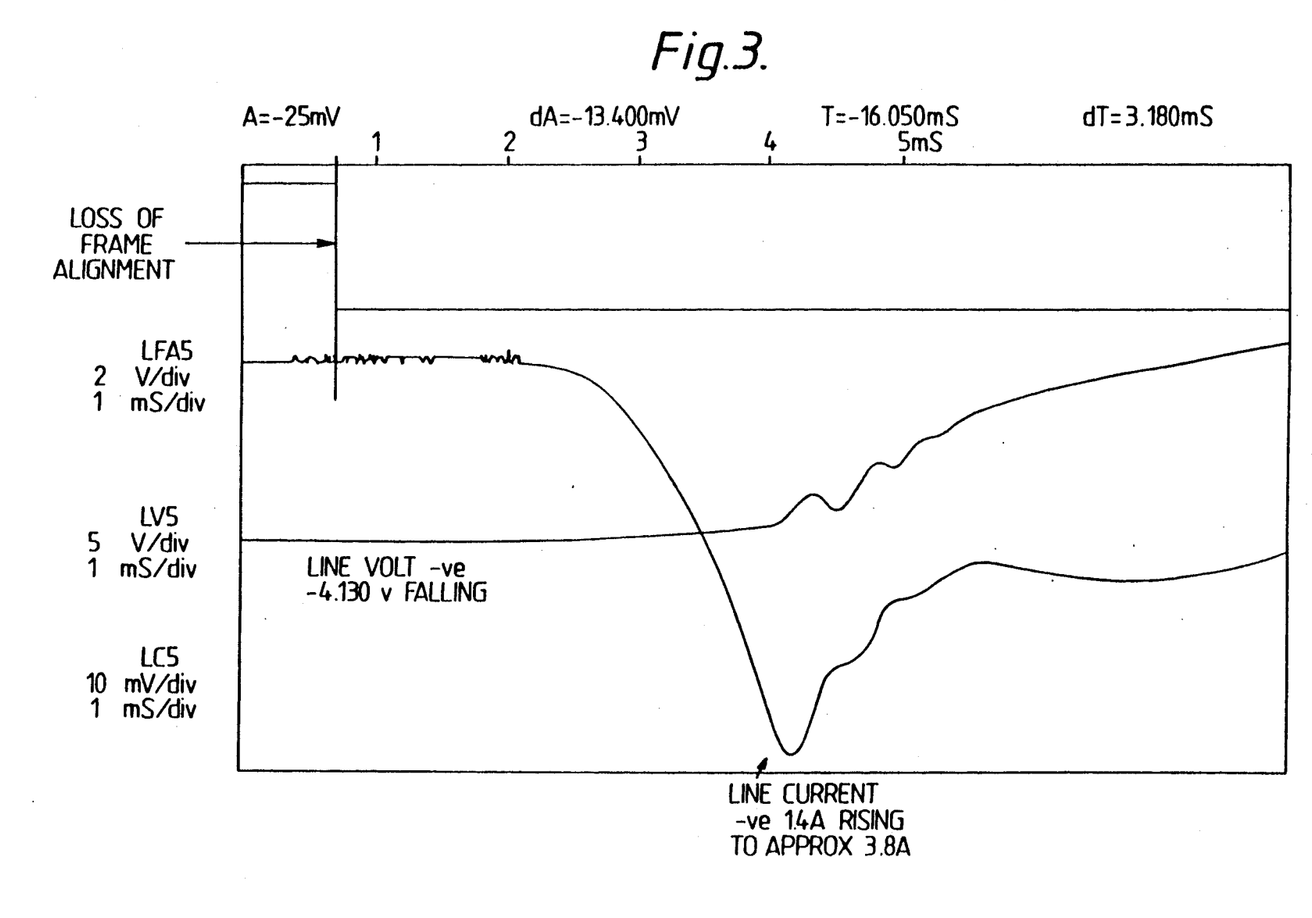
FIG. 3 shows, in relation to a second embodiment of the invention, a record of the change of feed current as a function of time elapsed since the occurrence of an intermittent fault.
Figure 6:
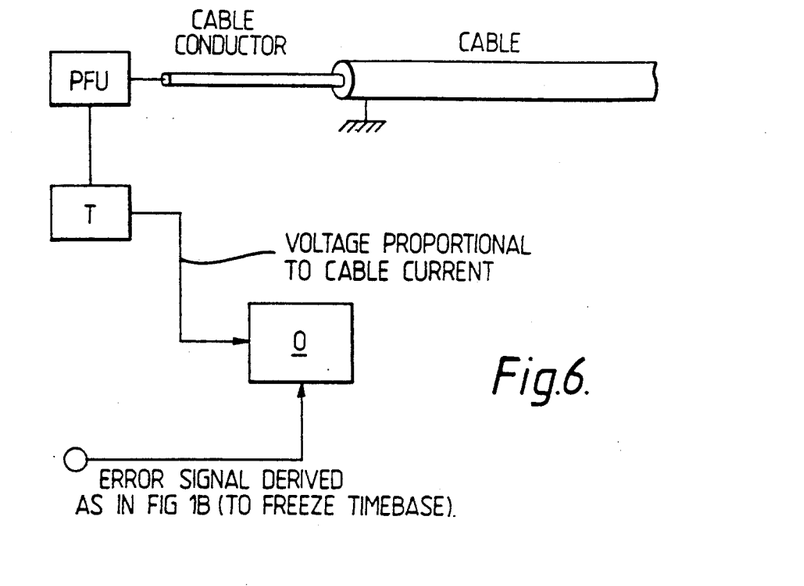
FIG. 6 shows schematically some of the equipment used in the second embodiment.

FIG. 6 shows the apparatus used to measure the time t. O is an oscilloscope with a "rolling" time base i.e. a time base which is re-started at a predetermined rate. A signal, initiated by the arrival of errors (from the same type of apparatus as in FIG. 1B) is used to "freeze" the time base. The signal deflecting the beam of the oscilloscope is derived from a DC type current "transformer" (e.g. a Hall effect device). A permanent record of the oscilloscope indication is then made, showing both the time of arrival of the optical circuit errors (loss of frame alignment) and the arrival curve of the current surge. FIG. 3 is a typical example of such a record.

The dot-dash line of FIG. 4 gives the data of FIG. 3 for a postulated length to the fault: the dash-dot line of FIG. 4 gives a corresponding calculation derived theoretically from the cable parameters, the assumed power feed unit impedance and the standing voltage on the cable before the fault. Where the two arrival curves do not quite match, some reiteration is required.

Figure 5:
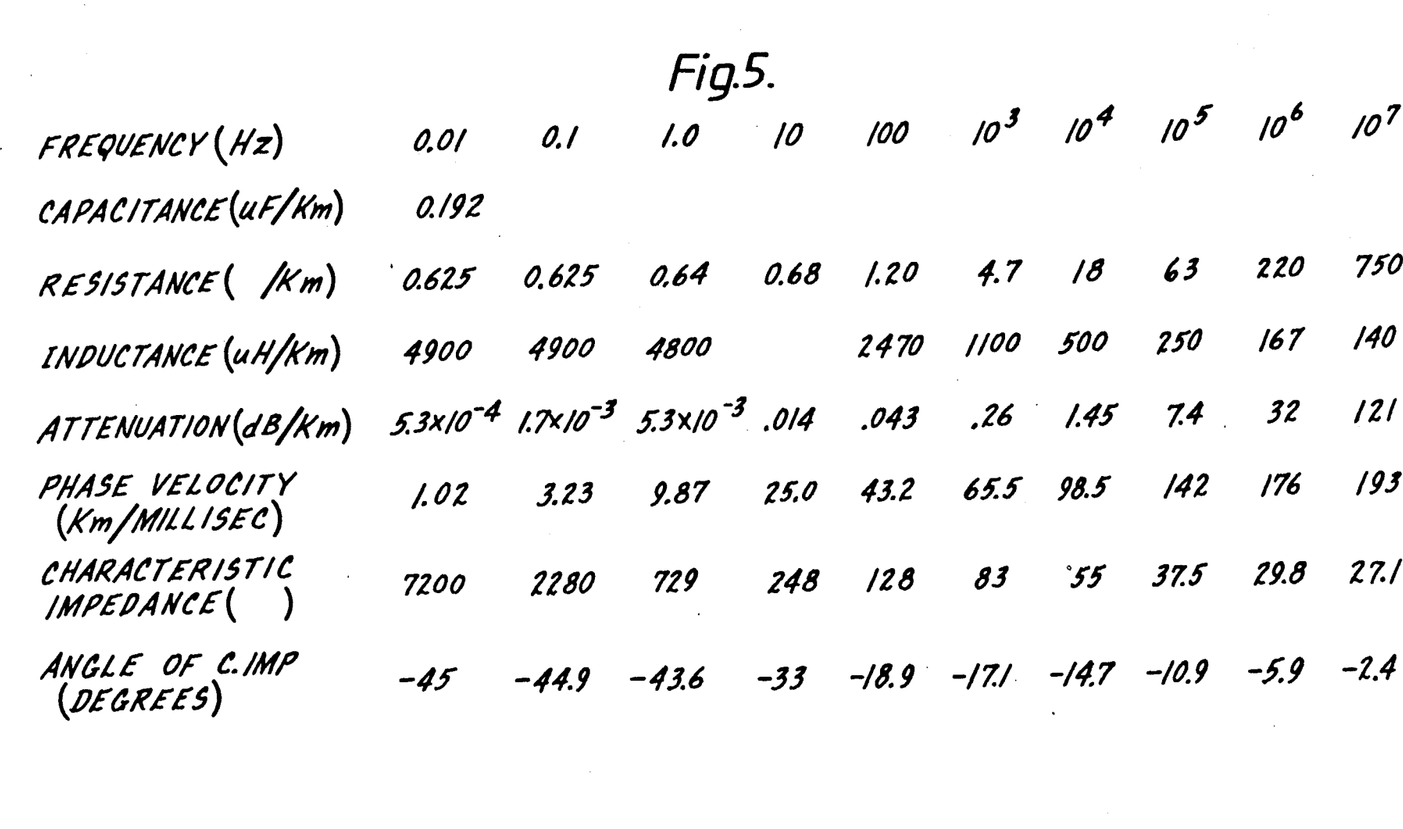
FIG. 5 is a table of cable parameters for use in the method of the second embodiment.
Figure 7:
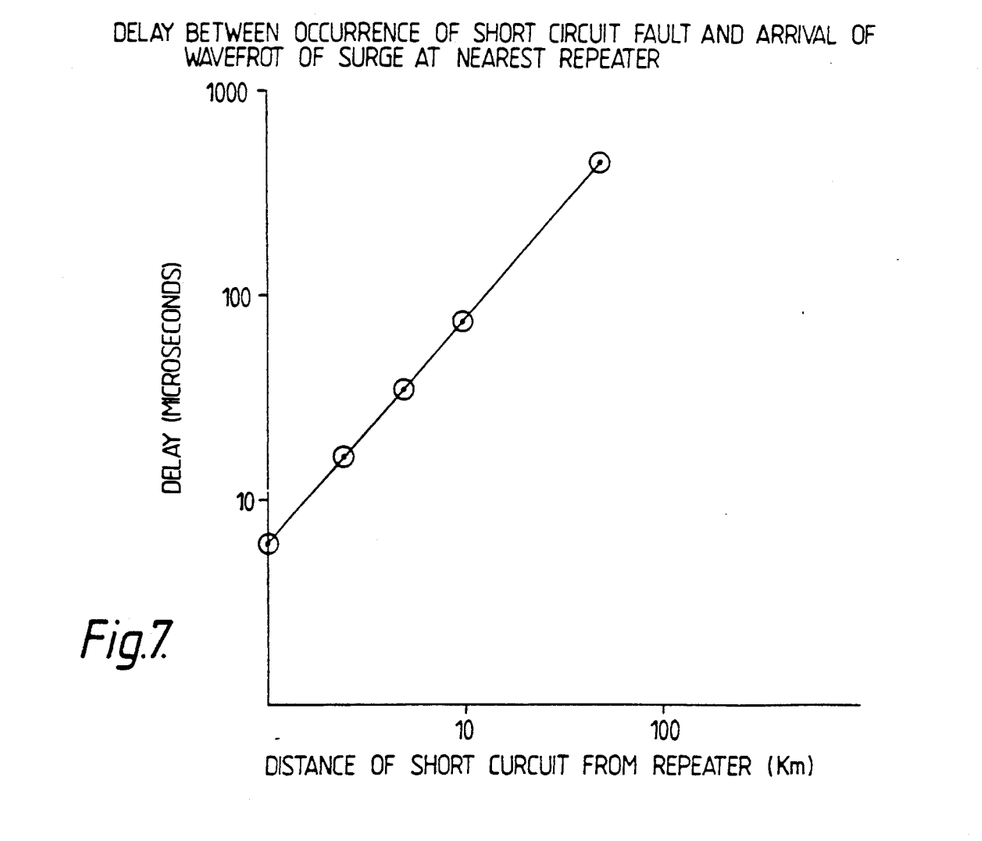
FIG. 7 is a graph showing the delay in the arrival of the short circuit surge wavefront at the nearest repeater.

FIG. 7 is a curve showing the delay in microseconds of the surge wavefront from the fault to the nearest repeater, calculated from the cable data given in FIG. 5 in a manner understood by those skilled in the art.

We claim:

1. A method of locating an intermittent electrical fault in the power feed circuit of an optical repeater simplex transmission system, the method comprising detecting the arrival of a first optical error signal at a terminal of the system, detecting the arrival of a second signal at a terminal of the system, said first signal having arisen at a repeater adjacent the fault as a result of said electrical fault and having travelled to said terminal via a first optical path, said second signal either being an electrical surge pulse which has travelled from the fault to a terminal via a power conductor of the system, or being a second optical error signal which has arisen at a repeater adjacent the fault and travelled to a second terminal of the system via a second optical path, and determining the location of the fault by determining the time separation between the arrival of such first and second signals, and the rate of travel of the signals.

2. A method as claimed in claim 1, wherein the second signal is an electrical surge pulse, the time of arrival being determined by matching the received surge pulse with a calculated value derived from electrical parameters of the cable and a postulated fault location.

3. A method as claimed in claim 2, wherein the arrival of the first error signal is used to freeze the rolling timebase of an oscilloscope used for determining the arrival of the second signal.

4. A method as claimed in claim 3, wherein the fault is an intermittent electrical fault which can be triggered by a voltage rise, said method including raising the system voltage at one end of the system to trigger the fault.

5. A method as claimed in claim 1, wherein the speed of propagation of signals along the paths of the system is measured by setting a repeater of the system into a loopback mode, injecting an error at one terminal, and starting a counter at said one terminal, and stopping the counter when the loopback returns the error signal to said one terminal.

6. A method as claimed in claim 5, wherein at one end of the system the transmit and receive sections of the terminal are looped back so that a received signal is transmitted back along the system, an error signal is injected at the end of the system remote from the loopback, and the speed of propagation of the error signal to transit the system from one end to the other and back again is used to calibrate for fault location.

7. A method of locating an intermittent electrical fault in the power feed circuit of an optical repeatered simplex transmission system, the method comprising detecting the arrival of a first optical error signal at a terminal of the system, detecting the arrival of a second optical error signal at a terminal of the system, said first signal having arisen at a repeater adjacent the fault as a result of said electrical fault and having travelled to said terminal via a first optical path, said second signal being a second optical error signal which has arisen at a repeater adjacent the fault and travelled to a second terminal of the system via a second optical path, and determining the location of the fault by determining the time separation between the arrival of said first and second optical error signals, wherein the time of arrival of a said first and second optical error signal is measured by a counter which is started by a further error signal purposely transmitted from one terminal and which is stopped by the said first and second optical error signal generated at the fault.

8. A method as claimed in claim 7, wherein a clock signal is sued as a source for counting to determine the time difference between the signals.

* * * * *